(12) United States Patent
Yu et al.

(10) Patent No.: US 8,806,301 B2
(45) Date of Patent: Aug. 12, 2014

(54) DATA WRITING METHOD FOR A FLASH MEMORY, AND CONTROLLER AND STORAGE SYSTEM USING THE SAME

(75) Inventors: Hsiang-Hsiung Yu, Taipei County (TW); Yi-Hsiang Huang, Hsinchu (TW); Chung-Lin Wu, Taichung (TW); Yu-Chung Shen, Kaohsiung County (TW)

(73) Assignee: Phison Electronics Corp., Miaoli (TW)

( * ) Notice: Subject to any disclaimer, the term of this patent is extended or adjusted under 35 U.S.C. 154(b) by 481 days.

(21) Appl. No.: 12/622,084

(22) Filed: Nov. 19, 2009

(65) Prior Publication Data
US 2011/0087950 A1   Apr. 14, 2011

(30) Foreign Application Priority Data
Oct. 12, 2009   (TW) ............................... 98134508 A (51) Int. Cl.
*G11C 29/00* (2006.01)

(52) U.S. Cl.
USPC ........................................................ 714/773

(58) Field of Classification Search
USPC ......... 714/6.1, 6.13, 6.2, 6.24, 25, 47.1, 47.2, 714/47.3, 718, 763, 764, 773, 710; 711/100, 102–104; 365/185.09, 365/185.24, 185.33
See application file for complete search history.

(56) References Cited

U.S. PATENT DOCUMENTS

| | | | |
|---|---|---|---|
| 5,909,334 A * | 6/1999 | Barr et al. ........................ | 360/53 |
| 6,842,793 B2 * | 1/2005 | Ohashi et al. ..................... | 710/5 |
| 7,647,544 B1 * | 1/2010 | Masiewicz ..................... | 714/770 |
| 7,765,426 B2 * | 7/2010 | Li ............................... | 714/6.13 |
| 2005/0204212 A1 * | 9/2005 | Noguchi et al. .............. | 714/710 |
| 2007/0233752 A1 * | 10/2007 | Bangalore et al. ............ | 707/202 |
| 2010/0122148 A1 * | 5/2010 | Flynn et al. ................... | 714/773 |
| 2011/0041005 A1 * | 2/2011 | Selinger ........................... | 714/6 |

* cited by examiner

*Primary Examiner* — Scott Baderman
*Assistant Examiner* — Joseph Kudirka
(74) *Attorney, Agent, or Firm* — J.C. Patents (57) ABSTRACT

A data writing method for writing data from a host system into a flash memory chip is provided, and the flash memory chip has a plurality of physical blocks. The method includes receiving a host writing command and write data thereof, and executing the host writing command. The method also includes giving a data program command for writing the write data into one of the physical blocks of the flash memory chip, and giving a command for determining whether data stored in the physical block has any error bit. Accordingly, the method can effectively ensure the correctness of data to be written into the flash memory chip.

13 Claims, 9 Drawing Sheets

FIG. 7

DATA WRITING METHOD FOR A FLASH MEMORY, AND CONTROLLER AND STORAGE SYSTEM USING THE SAME

CROSS-REFERENCE TO RELATED APPLICATION

This application claims the priority benefit of Taiwan application serial no. 98134508, filed on Oct. 12, 2009. The entirety of the above-mentioned patent application is hereby incorporated by reference herein and made a part of this specification.

BACKGROUND OF THE INVENTION

1. Field of the Invention

The present invention relates to a data writing method for a flash memory and particularly to a data writing method capable of effectively ensure that data is correctly written into a flash memory, and a flash memory controller and a flash memory storage system using the same.

2. Description of Related Art

Flash memory is the most adaptable memories to be applied in portable electronic products which are supplied power by batteries due to its data non-volatility, low power consumption, small volume, and non-mechanical structure. For example, a solid state drive (SSD) is a storage device that uses a NAND flash memory as its storage medium, and which has been broadly used in notebook computes as the main storage device.

A flash memory of a flash memory storage device has a plurality of physical blocks, and each physical block has a plurality of physical pages, wherein data must be written into a physical block according to the sequence of the physical pages in the physical block. Additionally, a flash memory may be classified into two types of NAND flash memory, a Single Level Cell (SLC) NAND flash memory and a Multi Level Cell (MLC) NAND flash memory, according to the number of bits that each memory cell thereof is capable of storing. In the SLC NAND flash memory, because an electric charge in one memory cell is only identified using one level, whether the bit stored in one memory cell represents '1' or '0' is thereby identified. Therefore, each memory cell only can store one bit of data.

Along with the improvement of flash memory manufacture processes, the MLC NAND flash memory has developed. To be specific, an electric charge in one memory cell can be identified using a plurality of levels in the MLC NAND flash memory. Therefore, one memory cell may store multiple bits of data in the MLC NAND flash memory. Accordingly, for the same number of memory cells, the number of pages in an MLC NAND flash memory is a multiple of the number of pages in an SLC NAND flash memory.

In particular, because one memory cell may stores multi-bits of data in the MLC NAND flash memory, the program for the physical blocks of the MLC NAND flash memory will include a plurality of phases. Taking a 2 level cell NAND flash memory as an example, the physical blocks thereof are programmed in a first phase and a second phase. The first phase is the programming of a lower page, and the physical property of the programming of the lower page is similar to the physical property of the programming of the SLC NAND flash memory. After the first phase is completed, the programming of an upper page may be executed (i.e. the second phase), wherein the speed of programming the lower page is faster than that of programming the upper page. Similarly, in an 8 level cell or a 16 level cell, each memory cell contains more pages and accordingly is programmed in more phases.

In the MLC NAND flash memory the programming of the upper page may be coupling with the programming of the lower page, therefore the reliability of the MLC NAND flash memory is lower than the SLC NAND flash memory. That is, the probability of occurring writing errors in the MLC NAND flash memory is higher than that in the SLC NAND flash memory. In particular, when one memory cell can store more bits of data in the MLC NAND flash memory, the probability of writing errors becomes higher. Thereof, how to ensure that data is correctly written into a flash memory is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

The present invention is directed to a data writing method capable of effectively ensuring that data is correctly written into a flash memory.

The present invention is directed to a flash memory controller capable of effectively ensuring that data is correctly written into a flash memory.

The present invention is directed to a flash memory system capable of effectively ensuring that data is correctly written into a flash memory.

According to an exemplary embodiment of the present invention, a data writing method for writing data from a host system into a flash memory chip is provided, wherein the flash memory chip includes a plurality of physical blocks. The data writing method includes configuring a flash memory controller; receiving a host write command and write data corresponding to the host write command from the host system; and executing the host write command by the flash memory controller. The data writing method also includes giving a data program command to the flash memory chip to write the write data into one of the physical blocks and giving a command to the flash memory chip to determine whether at least a portion of data stored in the physical block has any error bit during the execution of the host write command.

According to an exemplary embodiment of the present invention, a flash memory controller for writing data from a host system into a flash memory chip is provided, wherein the flash memory chip includes a plurality of physical blocks. The flash memory controller includes a microprocessor unit, a flash memory interface unit, a host interface unit, and a memory management unit. The flash memory interface unit is coupled to the microprocessor unit and configured to couple to the flash memory chip. The host interface unit is coupled to the microprocessor unit and receives a host write command and write data corresponding to the host write command from the host system. The memory management unit is coupled to the microprocessor unit and gives a data program command to the flash memory chip to write the write data into one of the physical blocks during the execution of the host write command. Additionally, the memory management unit gives a command to the flash memory chip to determine whether at least a portion of data stored in the physical block has any error bit during the execution of the host write command.

According to an exemplary embodiment of the present invention, a flash memory storage system including a connector, a flash memory chip, and a flash memory controller is provided. The flash memory chip has a plurality of physical blocks. The connector is configured to couple to a host system and receives a host write command and write data corresponding to the host write command from the host system. The flash memory controller is coupled to the flash memory chip and the connector, and gives a data program command to the flash memory chip to write the write data into one of the physical blocks during the execution of the host write command. Additionally, the flash memory controller gives a command to the flash memory chip to determine whether at least a portion of data stored in the physical block has any error bit during the execution of the host write command.

As described above, the data writing method provided by the present invention determines whether data written into a flash memory has any error bits during the execution of the host write command, thereby the correctness of the data written into the flash memory can effectively be ensured.

In order to make the aforementioned and other features and advantages of the invention more comprehensible, embodiments accompanying figures are described in detail below.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A flash memory storage device usually includes a flash memory chip and a controller (also referred to as a control circuit). The flash memory storage device is usually used together with a host system so that the host system can write data into or read data from the flash memory storage device. Besides, a flash memory storage device may also include an embedded flash memory and a software that can be executed by a host system and act as a controller of the embedded flash memory.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Figure 1A:
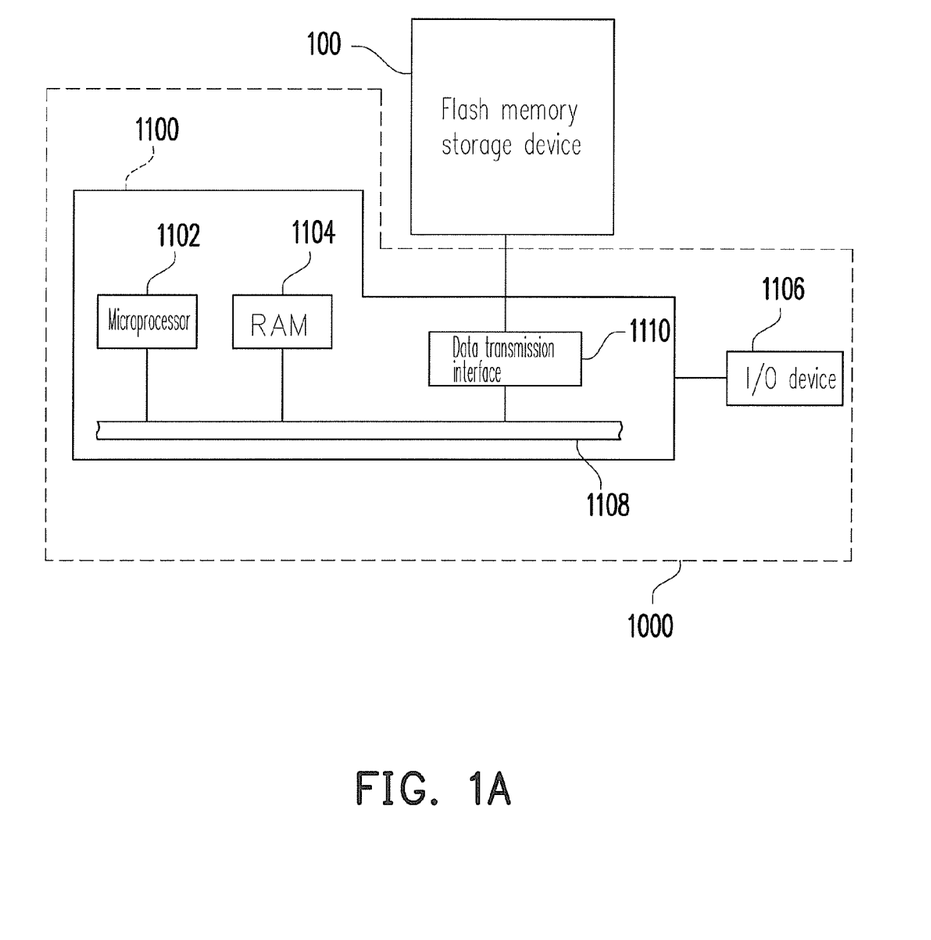
FIG. 1A is a schematic block diagram of a host system using a flash memory storage device according to a first exemplary embodiment of the present invention.

FIG. 1A is a schematic block diagram of a host system using a flash memory storage device according to a first exemplary embodiment of the present invention.

Figure 1B:
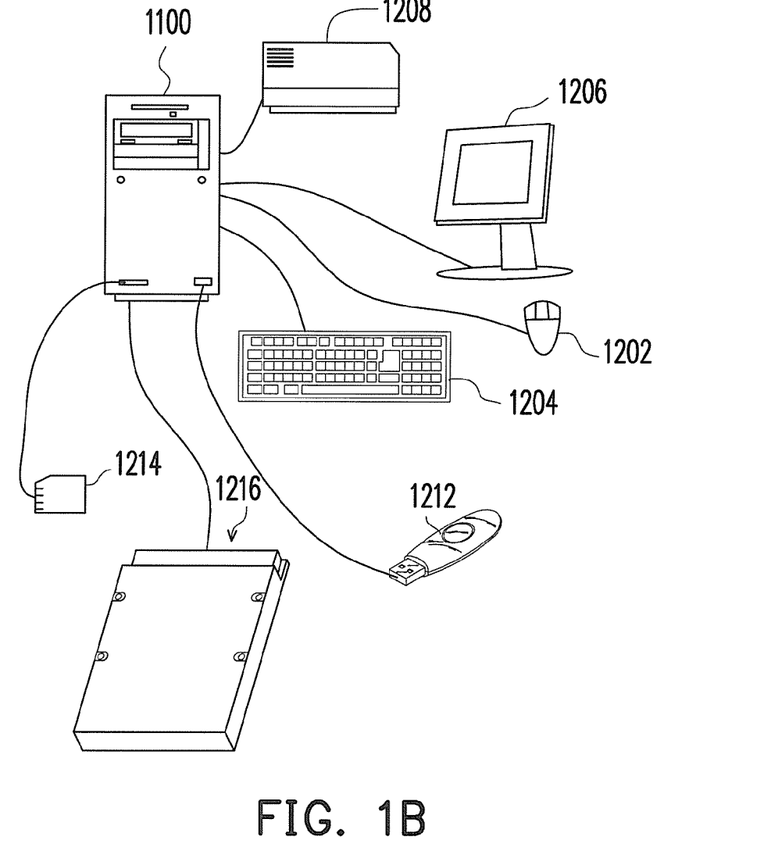
FIG. 1B is a diagram of a computer, an input/output device, and a flash memory storage device according to an exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 1B. It should be understood that the devices illustrated in FIG. 1B are not intended to limiting the I/O device 1106, and the I/O device 1106 may further include other devices.

In the present embodiment, the flash memory storage device 100 is coupled to other devices of the host system 1000 through the data transmission interface 1110. The host system 1000 can write data into or read data from the flash memory storage device 100 through the operations of the microprocessor 1102, the RAM 1104, and the I/O device 1106. For example, the flash memory storage device 100 may be a flash drive 1212, a memory card 1214, or a solid state drive (SSD) 1216 as shown in FIG. 1B.

Figure 1C:
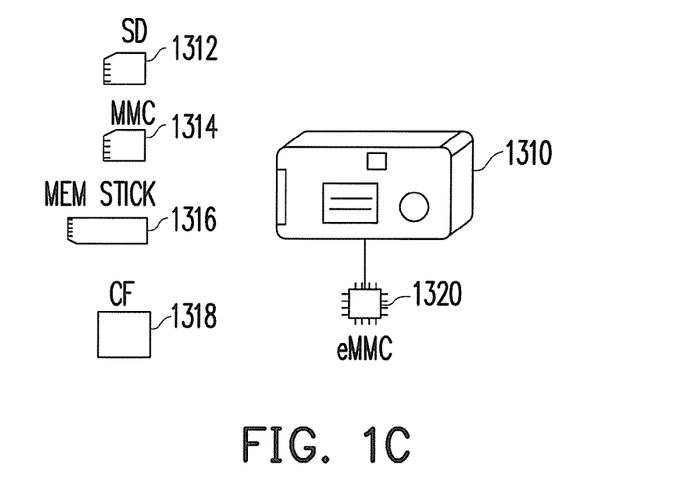
FIG. 1C is a schematic diagram of a host system and a flash memory storage device according to another exemplary embodiment of the present invention.

Generally speaking, the host system 1000 may be any system for storing data. Even though the host system 1000 is described as a computer system in the present exemplary embodiment, in another exemplary embodiment of the present invention, the host system 1000 may be a digital camera, a video camera, a telecommunication device, an audio player, or a video player. For example, if the host system is a digital camera (video camera) 1310, the flash memory storage device is then a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is directly coupled to a substrate of the host system.

Figure 1D:
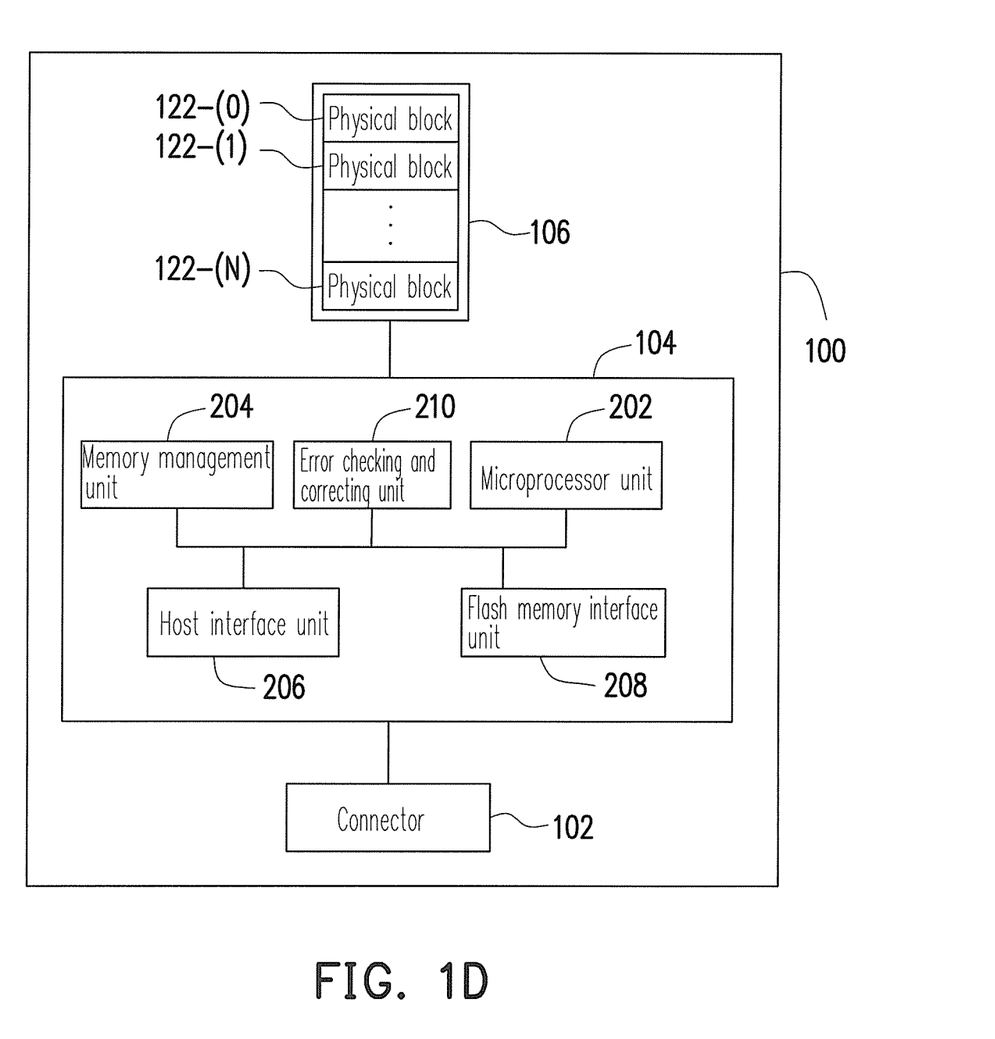
FIG. 1D is a schematic block diagram of the flash memory storage device in FIG. 1A.

FIG. 1D is a schematic block diagram of the flash memory storage device 100 in FIG. 1A.

Referring to FIG. 1D, the flash memory storage device 100 includes a connector 102, a flash memory controller 104, and a flash memory chip 106.

The connector 102 is coupled to the flash memory controller 104 and configured to couple to the host system 1000. In the present embodiment, the connector 102 is a serial advanced technology attachment (SATA) connector. However, the present invention is not limited thereto, and the connector 102 may also be a Parallel Advanced Technology Attachment (PATA) connector, a universal serial bus (USB) connector, an Institute of Electrical and Electronic Engineers (IEEE) 1394 connector, a peripheral component interconnect (PCI) express connector, a secure digital (SD) connector, a memory stick (MS) connector, a multi media card (MMC) connector, a compact flash (CF) connector, an integrated device electronics (IDE) connector, or other suitable connector.

The flash memory controller 104 executes a plurality of logic gates or control commands which are implemented in a hardware form or in a firmware form, so as to perform operations of writing, reading or erasing data in the flash memory chip 106 according to the commands of the host system 1000. The flash memory controller 104 includes a microprocessor unit 202, a memory management unit 204, a host interface unit 206, a flash memory interface unit 208 and an error checking and correcting unit 210.

The microprocessor unit 202 is the main control unit of the flash memory controller 104, and cooperates with the memory management unit 204, the host interface unit 206, the flash memory interface unit 208 and the error checking and correcting unit 210 to carry out various operations of the flash memory storage device 100.

The memory management unit 204 is coupled to the microprocessor unit 202, and executes a data writing mechanism and a block management mechanism according to the present exemplary embodiment. Below, the operation of the memory management unit 204 will be described in detail with reference to accompanying drawings.

In the present exemplary embodiment, the memory management unit 204 is implemented in the flash memory controller 104 as a firmware form. For example, the memory management unit 204 including a plurality of control instructions is burned into a program memory (for example, a read only memory (ROM)), and the program memory is embedded into the flash memory controller 104. When the flash memory storage device 100 is in operation, the control instructions of the memory management unit 204 are executed by the microprocessor unit 202 to accomplish the block management mechanism and the data writing mechanism according to the present embodiment.

In another exemplary embodiment of the present invention, the control instructions of the memory management unit 204 may also be stored in a specific area (for example, the system area in a flash memory exclusively used for storing system data) of the flash memory chip 106 as program codes. Similarly, when the flash memory storage device 100 is in operation, the program instructions of the memory management unit 204 are executed by the microprocessor unit 202. In addition, in yet another exemplary embodiment of the present invention, the memory management unit 204 may also be implemented in the flash memory controller 104 in a hardware form.

The host interface unit 206 is coupled to the microprocessor unit 202 and configured to receive and identify commands and data received from the host system 1000. Namely, the commands and data sent by the host system 1000 are passed to the microprocessor unit 202 through the host interface unit 206. In the present exemplary embodiment, the host interface unit 206 is a SATA interface corresponding to the connector 102. However, it is to be understood that the present invention is not limited thereto, and the host interface unit 210 may also be a PATA interface, a USB interface, an IEEE 1394 interface, a PCI Express interface, a SD interface, a MS interface, a MMC interface, a CF interface, an IDE interface, or other suitable types of interfaces for data transmission.

The flash memory interface unit 208 is coupled to the microprocessor unit 202 and configured to access the flash memory chip 106. Namely, data to be written into the flash memory chip 106 is converted by the flash memory interface unit 208 into a format acceptable to the flash memory chip 106.

The error checking and correcting unit 210 is coupled to the microprocessor unit 202 and configured to perform an error checking and correcting process to ensure the correctness of data. To be specific, when the memory management unit 204 receives a host write command from the host system 1000, the error checking and correcting unit 210 generates an error checking and correcting code (ECC code) corresponding to write date of the host write command, and the memory management unit 204 writes the write data and the ECC code into the flash memory chip 106. And, when the memory management unit 204 reads data from the flash memory chip 106, the memory management unit 204 simultaneously reads the ECC code corresponding the read data, and the error checking and correcting unit 210 performs the error checking and correcting process to the read data based on the ECC code corresponding to the read data. In the present exemplary embodiment, the maximum number of error bits which can be corrected by the error checking and correcting unit 210 is 26. And, the maximum number of error bits which can be corrected by the error checking and correcting unit is referred as "the maximum number of error correcting bits" hereafter. Namely, in a case where the number of error bits in data is not larger than 26, the error checking and correcting unit 210 is capable of detecting the error bits and correcting the data. It should be noted that the present invention is not limited thereto and the maximum number of error correcting bits of the error checking and correcting unit may be any suitable value, such as 4, 16 or 64.

Figure 2:
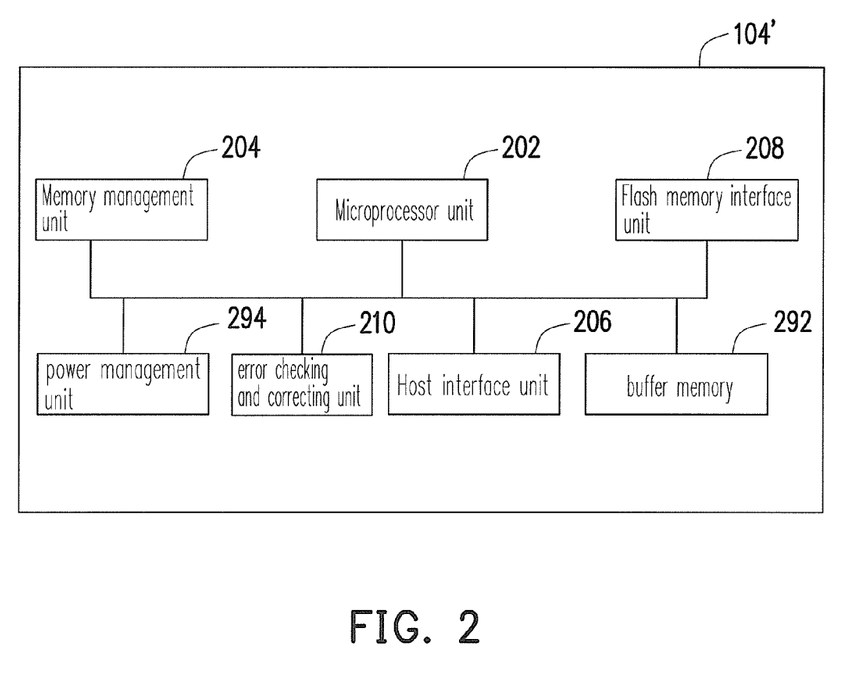
FIG. 2 is a schematic block diagram of a flash memory controller according to another exemplary embodiment of the present invention.

In another exemplary embodiment of the present invention, the flash memory controller may further include some general function modules. FIG. 2 is a schematic block diagram of a flash memory controller according to another exemplary embodiment of the present invention.

Referring to FIG. 2, besides the microprocessor unit 202, the memory management unit 204, the host interface unit 206, the flash memory interface unit 208 and the error checking and correcting unit 210, a flash memory controller 104' further includes buffer memory 292 and a power management unit 294.

The buffer memory 292 is coupled to the microprocessor unit 202 and configured to temporarily store data and commands from the host system 1000 or data from the flash memory chip 106.

The power management unit 294 is coupled to the microprocessor unit 202 and configured to control the power of the flash memory storage device 100.

The flash memory chip 106 is coupled to the flash memory controller 104 for storing data. The flash memory chip 106 has a plurality of physical blocks 122-(0)~122-(N). Each of the physical blocks 122-(0)~122-(N) is the smallest erasing unit. That is to say, each of the physical blocks has a minimum number of memory cells for being erased altogether. Each physical block has several pages. In the present exemplary embodiment, each of the pages is the smallest programming unit. In other words, each page is the smallest unit for writing data or reading data. Each of the pages usually includes a user data area and a redundancy area. The data area is used to store user data, and the redundant area is used to store system data (for example, an error checking and correcting (ECC) Code). In the exemplary embodiment, the flash memory chip 106 is a multi-level cell (MLC) NAND flash memory chip. However, the present invention is not limited thereto, and in another embodiment of the present invention, the flash memory chip 106 may also be a single level cell (SLC) NAND flash memory.

Figure 3:
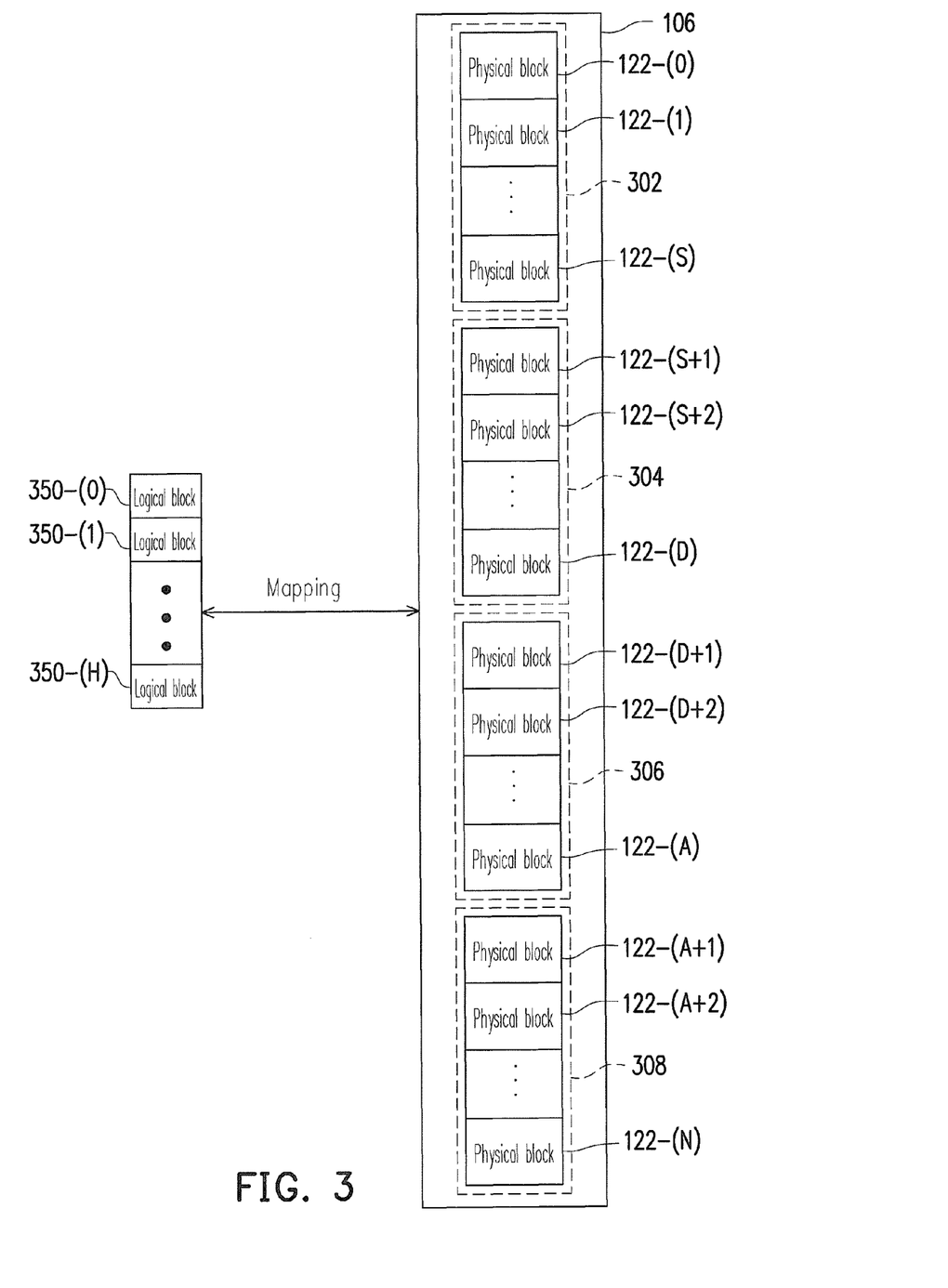
FIG. 3 is a schematic block diagram illustrating a flash memory chip according to the first exemplary embodiment of the present invention.
Figure 4A:
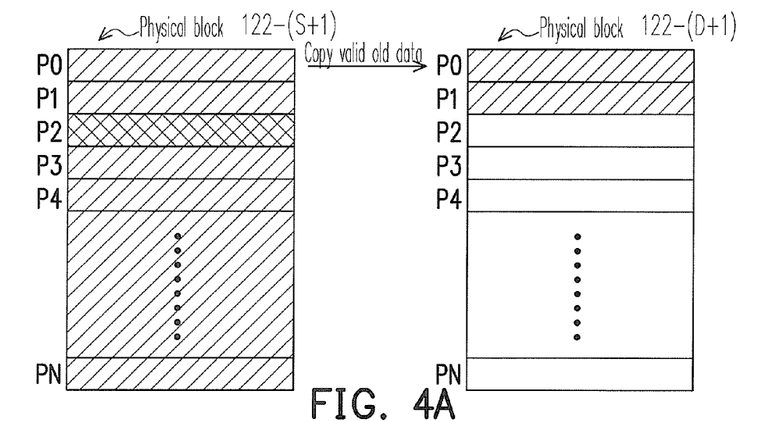
FIGS. 4A~4C are schematic diagrams illustrating operations of physical blocks according to the first exemplary embodiment of the present invention.
Figure 4B:
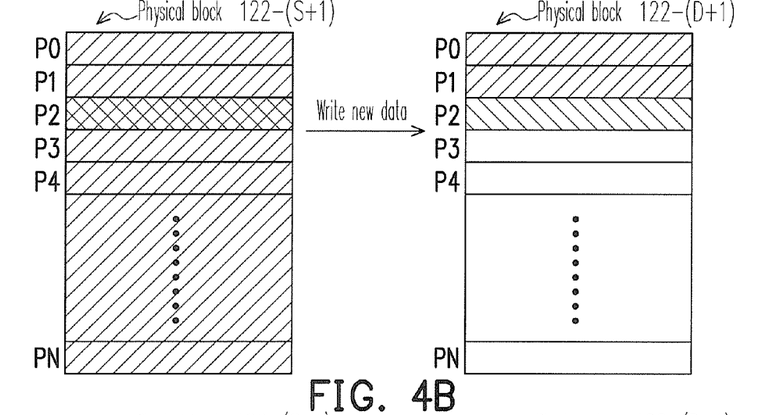
Figure 4C:
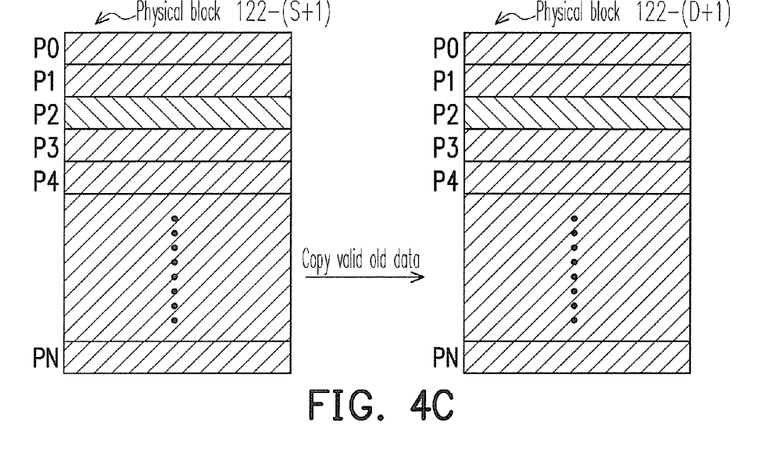

FIG. 3 is a schematic block diagram illustrating a flash memory chip according to the first exemplary embodiment of the present invention and FIGS. 4A-4C are schematic diagrams illustrating operations of physical blocks according to the first exemplary embodiment of the present invention.

Referring to FIG. 4A~4C, because the memory cells of the flash memory chip 106 only be programmed from '1' to '0', data in a physical block has to be erased before the physical block is updated. However, since data is written into a flash memory in unit of pages and is erased from the same in unit of physical blocks, the physical blocks in the flash memory chip 106 are alternatively used for storing data.

To be specific, the memory management unit 204 logically groups the physical blocks into a system area 302, a data area 304, a spare area 306, and a replacement area 308.

The physical blocks 122-(0)~122-(S) logically belonging to the system area 302 are configured to record system data, wherein the system data includes the manufacturer and model of the flash memory chip, the number of zones in flash memory chip, the number of physical blocks in each zone, and the number of pages in each physical block.

The physical blocks 122-(S+1)~122-(D) logically belonging to the data area 304 stores the user data and are the physical blocks generally corresponding to the logical blocks accessed by the host 1000. That is to say, the physical blocks of the data area are blocks which store valid data.

The physical blocks 122-(D+1)~122-(A) logically belonging to the spare area 306 are configured to substitute the physical blocks in the data area 304. Accordingly, the physical blocks in the spare area are either blank or available blocks (i.e., no data is recorded in these blocks or data recorded in these blocks is marked as invalid data). In other words, the physical blocks in the data area and the spare area are alternatively configured to store data written into the flash memory storage device 100 by the host system 1000.

The physical blocks 122-(A+1)~122-(N) logically belonging to the replacement area 308 are replacement physical blocks. For example, when the flash memory chip 106 is manufactured in the factory, 4% of the physical blocks thereof are reserved for replacement (i.e., the substitute physical units). Namely, when any physical block in the system area 302, the data area 304, and the spare area 306 is damaged, a physical block in the replacement area 308 is configured to replace the damaged physical block (i.e., the bad block). Thus, if there are still available physical blocks in the replacement area 308 and a physical block is damaged, the memory management unit 204 selects an available physical block from the replacement area 308 for replacing the damaged physical block. If there is no more available physical block in the replacement area 308 and a physical block is damaged, the flash memory storage device 100 is announced as being in a write-protect status and data cannot be written therein.

Because data from the host system 1000 is written into the flash memory storage device 100 in the alternative manner described above, the flash memory controller 104 provides logical blocks 350-(0)~350-(H) to the host system 1000 for accessing data and maintains a logical address-physical address mapping table for recording the mapping relationships between the logical blocks 350-(0)~350-(H) and the physical blocks 122-(0)~122-(N).

For example, when the host system is about to store data into the logical block 350-(0), the flash memory controller 104 gets to know that the logical block 350-(0) is currently mapped to the physical block 122-(S+1) logically belonging to the data area 304 according to the logical address-physical address mapping table. Thus, the memory management unit 204 updates the data in the physical block 122-(S+1), and meanwhile, the flash memory controller 104 gets a physical block 122-(D+1) from the spare area 306 to substitute the physical block 122-(S+1) of the data area 304. However, the memory management unit 204 does not instantly move all the valid data in the physical block 122-(S+1) into the physical block 122-(D+1) and erase the physical block 122-(S+1) when the memory management unit 204 writes the new data into the physical block 122-(D+1). To be specific, the memory management unit 204 copies the valid data (i.e., the pages P0 and P1) to the physical block 122-(D+1) before the page for writing the new data in the physical block 122-(S+1) (as shown in FIG. 4A) and writes the new data (i.e., the pages P2 in the physical block 122-(D+1)) into the physical block 122-(D+1) (as shown in FIG. 4B). By now, the flash memory controller 104 completes the data writing operation and responds to the host system 1000 that the write command has been executed. Because the valid data in the physical block 122-(S+1) may become invalid during a next operation (for example, a write command), instantly moving all the valid data in the physical block 122-(S+1) to the physical block 122-(D+1) may become meaningless. In this case, an integration of the contents of the physical block 122-(S+1) and the physical block 122-(D+1) is a complete content of the mapping logic block 350-(0). Here, at this time, the physical block 122-(S+1) and the physical block 122-(D+1) are referred to as mother-child blocks. The number of mother-child blocks is determined according to the size of a buffer memory in the flash memory controller 104, and the action of temporarily maintaining such a mother-child relationship is referred to as opening mother-child blocks.

Thereafter, the flash memory controller 104 integrates the physical block 122-(S+1) and the physical block 122-(D+1) into a single physical block only when the contents of the two are to be actually combined, so that the efficiency of using physical blocks can be improved. The operation of integrating the physical blocks is also referred to as closing mother-child blocks.

For example, as shown in FIG. 4C, when the host system 1000 transfers a write command to the flash memory controller 104 to store data into another logical block and the memory management unit 204 determines that the number of opening mother-child blocks has reached the upper limit of the system and accordingly needs to integrate the physical block 122-(S+1) and the physical block 122-(D+1), the memory management unit 204 copies the remaining valid data (i.e., the pages P3~PN) in the physical block 122-(S+1) to the physical block 122-(D+1), then erases the physical block 122-(S+1) and links the physical block 122-(S+1) to the spare area 306. Meanwhile, the memory management unit 204 links the physical block 122-(D+1) to the data area 304 and maps the logical block 350-(0) to the physical block 122-(D+1) in the logical address-physical address mapping table, so as to close the mother-child blocks.

In the present exemplary embodiment, when the host interface unit 206 receives a host write command and write data corresponding to the host write command from the host system 1000, the memory management unit 204 gives a data program command to the flash memory chip 106 for writing the write data from the host system 1000 into the physical blocks. To be specific, each of the logical blocks 350-(0)~350-(H) includes a plurality of logical pages, and each of the logical pages is composed of several logical addresses. Accordingly, when the host system 1000 accesses data at the logical addresses, the memory management unit 204 actually writes data into or read data from the physical page of the physical block mapped to the logical block that the accessed logical addresses belong to. In the exemplary embodiment, the memory management unit 204 transforms the logical addresses instructed in the host write command to a mapped logical block by using a logical operation formula, and gets the physical block mapped to the mapped logical block based on the logical address-physical address mapping table.

In particular, after the write data is written into the page of the physical block, the memory management unit 204 gives a read command to the flash memory chip 106 for reading data which just is written, and the error checking and correcting unit 210 performs the error checking and correcting process to the read data to determine whether an error occurs during the operation of writing the write data. For example, after the memory management unit 204 writes the write data into the physical page P2 of the physical block 122-(D+1) by giving the data program command, the memory management unit 204 gives the read command to read data stored in the physical page P2 of the physical block 122-(D+1), and the error checking and correcting unit 210 performs the error checking and correcting process to the read data to determine whether the read data has any error bit. And, when the read data has at least one error bit, the memory management unit 204 identifies that an error occurs during the operation of writing the write data and the data stored in the physical page P2 of the physical block 122-(D+1) is not correct. Namely, in the present exemplary embodiment, during the execution of a host write command, besides the operation of writing the write data into the flash memory chip 106, the memory management unit 204 further reads the write data to verify whether the write data correctly is written. Here, "during the execution of the host write command" means a period which is from a time point of giving a host write command to the flash memory controller 104 by the host system 1000 to a time point of sending an acknowledgement message (i.e. a message which informs that the host write command is completed) to the host system 1000 by the flash memory controller 104.

For example, during the execution of a host write command, if the error checking and correcting unit 210 determines the data read from the physical page P2 of the physical block 122-(D+1) has error bits and the number of error bits is larger than the maximum number of error correcting bits of the error checking and correcting unit 210 (i.e. the error checking and correcting unit 210 can not correct the error bits), memory management unit 204 moves valid data stored in other physical pages of the physical block 122-(D+1) to another physical block (e.g. the physical block 122-(D+2)) and marks the physical block 122-(D+1) as a bad physical block. And, the memory management unit 204 sends a write error message to the host system 1000. For example, the host system 1000 may re-send the host write command and the write data corresponding to the host write command according to the write error message.

Additionally, in a case where the error checking and correcting unit 210 determines the data read from the physical page P2 of the physical block 122-(D+1) has error bits, if the number of error bits is not larger than the maximum number of error correcting bits of the error checking and correcting unit 210 (i.e. the error checking and correcting unit 210 can correct the error bits), the memory management unit 204 determines whether the number of error bits is larger than an error bit threshold value. And, if the number of error bits is larger than the error bit threshold value, the memory management unit 204 moves valid data stored in all of the physical pages of the physical block 122-(D+1) to another physical block (e.g. the physical block 122-(D+2)) and marks the physical block 122-(D+1) as the bad physical block. Here, the error bit threshold value may be any suitable value. To be specific, in the case where the number of error bits of the data is not larger than the maximum number of error correcting bits of the error checking and correcting unit 210, when the number of error bits which occur in the data is larger than the error bit threshold value, the physical block stored the data is in a very unreliable status. Thus, the memory management unit 204 marks the physical block as the bad physical block. In the present exemplary embodiment, the error bit threshold value is set as 50% of the maximum number of error correcting bits of the error checking and correcting unit 210.

Furthermore, in the case where the number of error bits of the data is not larger than the error bit threshold value, the memory management unit 204 marks the physical block 122-(D+1) as an unreliable physical block. To be specific, the memory management unit 204 uses an unreliable physical block table for recording information related to the unreliable physical block. In particular, subsequently, when the memory management unit 204 performs write operations to store data in the alternative manner, the physical blocks recorded in the unreliable physical block table will not be considered to be used first. For example, the memory management unit 204 first uses the physical blocks of the replacement area 308 to store data. And, only when the bad physical blocks are too many and the write operations can not be performed to write data, the memory management unit uses the physical blocks recorded in the unreliable physical block table to write the data.

It should be mentioned that the memory management unit 204 reads data which just is written from a physical block to verify whether the data is written correctly when the memory management unit 204 performs the write operation to the physical block. However, the present invention is not limited thereto, in another exemplary embodiment of the present invention, the memory management unit 204 further read data stored in other physical pages of the written physical block to determine the status of the written physical block.

Figure 5:
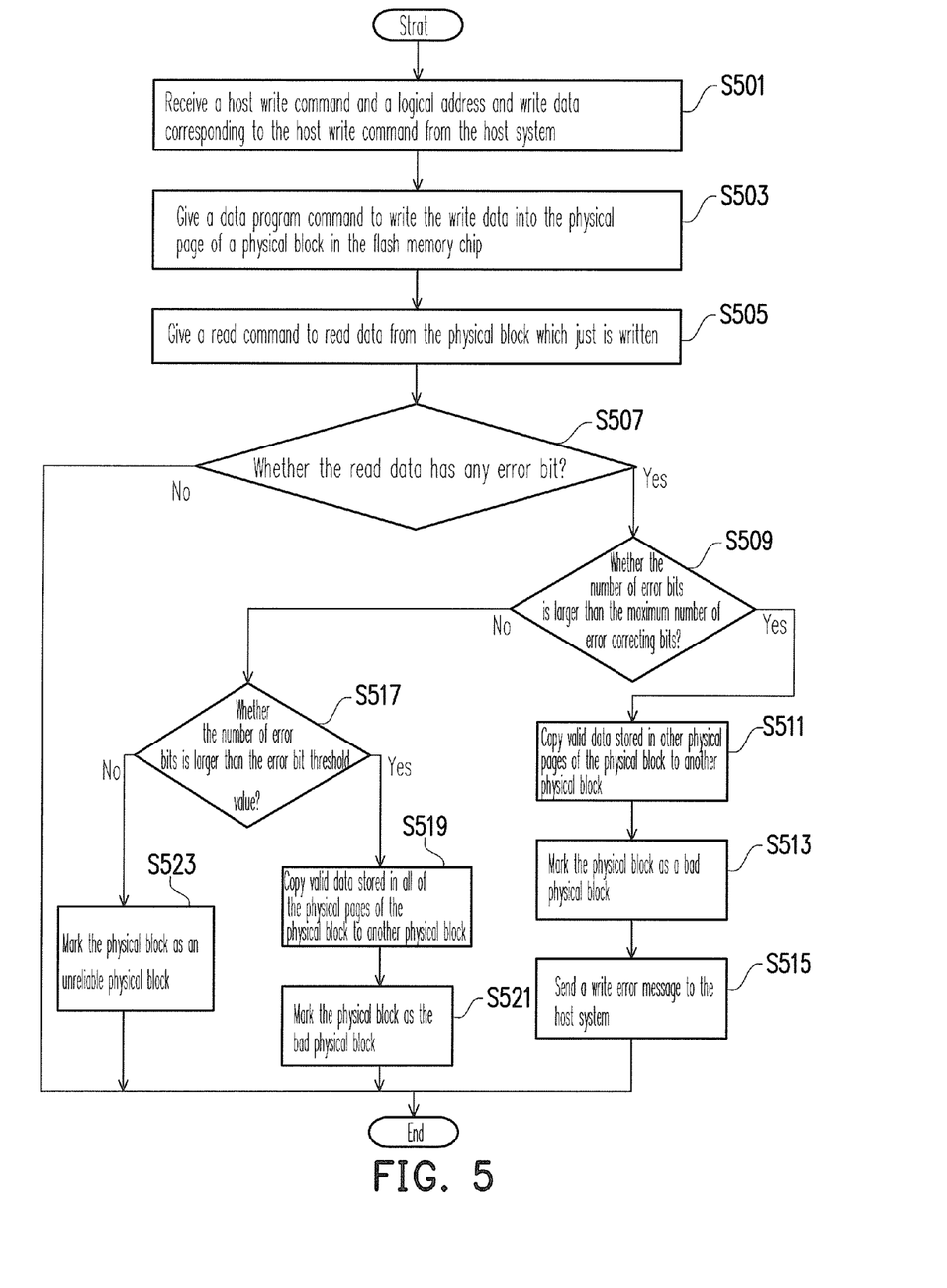
FIG. 5 is a flowchart illustrating a data writing method according to the first embodiment of the present invention.

FIG. 5 is a flowchart illustrating a data writing method according to the first embodiment of the present invention.

Referring to FIG. 5, in step S501 the flash memory controller 104 receives a host write command and a logical address and write data corresponding to the host write command from the host system 1000.

In step S503, the memory management unit 204 of the flash memory controller 104 uses a data program command to write the write data into the physical page of a physical block in the flash memory chip 106 (e.g. the physical page P2 of the physical block 122-(D+1)) based on the logical block that the logical address corresponding to the host write command belongs to.

After that, in step S505, memory management unit 204 gives a read command to read data from the physical block which just is written (e.g. the physical page P2 of the physical block 122-(D+1)), and in step S507, the error checking and correcting unit 210 performs the error checking and correcting process to the read data to determine whether the read data has any error bit.

If in the step S507 the error checking and correcting unit 210 determines that the read data does not have any error bit, the process shown in FIG. 5 is terminated.

If in the step S507 the error checking and correcting unit 210 determines that the read data has at least one error bit, in step S509 the memory management unit 204 determines whether the number of error bits is larger than the maximum number of error correcting bits of the error checking and correcting unit 210 based on the result of the error checking and correcting process. And, if the number of error bits is larger than the maximum number of error correcting bits, in step S511 the memory management unit 204 copies valid data stored in other physical pages of the physical block to another physical block (e.g. the physical block 122-(D+2)) and in step S513 the memory management unit 204 marks the physical block (i.e. the physical block is written in step S503) as the bad physical block. Then, in the step S515 the memory management unit 204 sends a write error message to the host system 1000, and the process shown in FIG. 5 is terminated.

If the number of error bits is not larger than the maximum number of error correcting bits, in step S517 the memory management unit 204 determines whether the number of error bits is larger than the error bit threshold value based on the result of the error checking and correcting process. If the number of error bits is larger than the error bit threshold value, in step S519 the memory management unit 204 copies valid data stored in all of the physical pages of the physical block to another physical block (e.g. the physical block 122-(D+2)). And, in the step S521 the memory management unit 204 marks the physical block (i.e. the physical block is written in step S503) as the bad physical block, and the process shown in FIG. 5 is terminated.

If the number of error bits is not larger than the error bit threshold value, in step S523 the memory management unit 204 marks the physical block (i.e. the physical block is written in step S503) as the unreliable physical block, and the process shown in FIG. 5 is terminated. As described above, for example, in step S523 the memory management unit 204 uses the unreliable physical block table for recording information related to the physical block which is marked as the unreliable physical block.

It should be mentioned that in the exemplary embodiment, the memory management unit 204 reads data which just is written from a physical block and the error checking and correcting unit 210 performs the error checking and correcting process to determine whether the data is written correctly when the host write command is executed. However, the present invention is not limited thereto, in another exemplary embodiment of the present invention, the memory management unit 204 may compare the read data and the writing data from the host system 1000 bit by bit to determine whether the read data has any error bit and the number of error bits thereof.

Second Exemplary Embodiment

Figure 6:
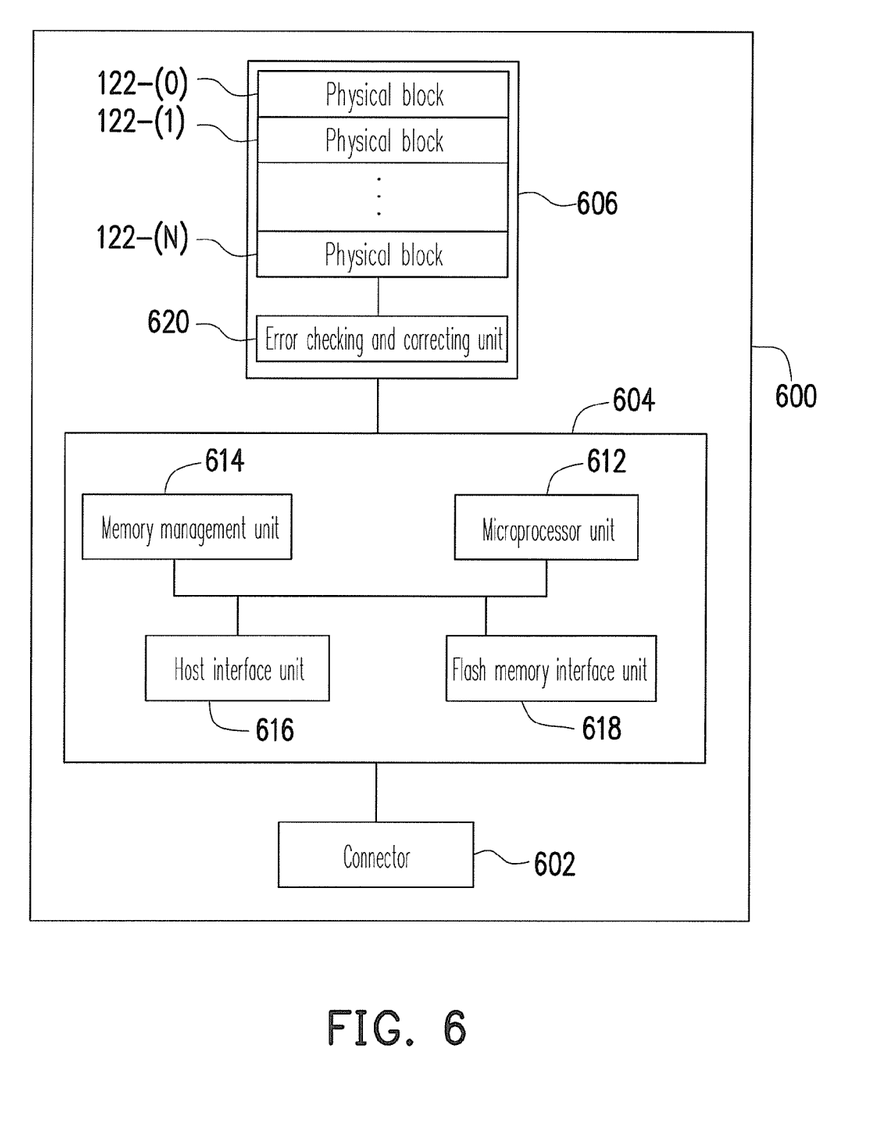
FIG. 6 is a schematic block diagram illustrating a flash memory storage system according to a second exemplary embodiment of the present invention.

FIG. 6 is a schematic block diagram illustrating a flash memory storage system according to a second exemplary embodiment of the present invention.

The flash memory storage device 600 is coupled to other devices of the host system 1000 through the data transmission interface 1110. Data can be written into or read from the flash memory storage device 600 through the operations of the microprocessor 1102, the RAM 1104, and the I/O device 1106. Similarly, the flash memory storage device 600 may be the flash drive 1212, the memory card 1214, or the solid state drive (SSD) 1216 as shown in FIG. 1B, or the SD card 1312, the MMC card 1314, the memory stick 1316, the CF card 1318 or the embedded storage device 1320 (as shown in FIG. 1C). The embedded storage device 1320 includes an embedded MMC (eMMC). It should be mentioned that the eMMC is directly coupled to a substrate of the host system.

Referring to FIG. 6, the flash memory storage device 600 includes a connector 602, a flash memory controller 604, and a flash memory chip 606.

The connector 602 is coupled to the flash memory controller 604 and configured to connect to the host system 1000. In the present embodiment, the connector 602 is a SATA connector. However, the present invention is not limited thereto, and the connector 602 can also be a PATA connector, a USB connector, an IEEE 1394 connector, a PCI Express connector, an MS connector, an MMC connector, an SD connector, a CF connector, an IDE connector, or other suitable connectors.

The flash memory controller 604 executes a plurality of logic gates or control commands which are implemented in a hardware form or in a firmware form, so as to perform operations of writing, reading or erasing data in the flash memory chip 606 according to the commands of the host system 1000. The flash memory controller 604 includes a microprocessor unit 612, a memory management unit 614, a host interface unit 616 and a flash memory interface unit 618. The structure and functionality of the microprocessor unit 612, the host interface unit 616, and the flash memory interface unit 618 essentially are similar to the structure and functionality of the microprocessor unit 202, the host interface unit 206, and the flash memory interface unit 208, so they will not be repeated here.

The memory management unit 614 is coupled to the microprocessor unit 612, and executes a data writing mechanism and a block management mechanism according to the present exemplary embodiment. Below, the operation of the memory management unit 614 will be described in detail with reference to accompanying drawings.

In the present exemplary embodiment, the memory management unit 614 is implemented in the flash memory controller 604 as a firmware form. For example, the memory management unit 614 including a plurality of control instructions is burned into a program memory (for example, a read only memory (ROM)), and the program memory is embedded into the flash memory controller 604. When the flash memory storage device 600 is in operation, the control instructions of the memory management unit 614 are executed by the microprocessor unit 612 to accomplish the block management mechanism and the data writing mechanism according to the present embodiment.

In another exemplary embodiment of the present invention, the control instructions of the memory management unit 614 may also be stored in a specific area (for example, the system area in a flash memory exclusively used for storing system data) of the flash memory chip 606 as program codes. Similarly, when the flash memory storage device 600 is in operation, the program instructions of the memory management unit 614 are executed by the microprocessor unit 612. In addition, in yet another exemplary embodiment of the present invention, the memory management unit 614 may also be implemented in the flash memory controller 104 in a hardware form.

The flash memory chip 606 is coupled to the flash memory controller 604 for storing data. The flash memory chip 606 is a MLC NAND flash memory chip and has a plurality of physical blocks 122-(0)~122-(N) and an error checking and correcting unit 620. The configuration and operation of the physical blocks in the second exemplary embodiment are identical to the ones in the first exemplary embodiment, a detailed description is omitted.

The error checking and correcting unit 620 is configured to perform an error checking and correcting process to ensure the correctness of data. To be specific, when the memory management unit 614 receives a host write command and write data corresponding to the host write command from the host system 1000 and writes the write data into the flash memory chip 606, the error checking and correcting unit 620 generates an ECC code corresponding to the write date, and the generated error checking and correcting code is written into the physical block 122-(0)~122-(N) with the write data. Then, when the memory management unit 614 reads data from the flash memory chip 606, the error checking and correcting unit 620 performs the error checking and correcting process to the read data based on the ECC code corresponding to the read data. In the present exemplary embodiment, the maximum number of error correcting bits of the error checking and correcting unit 620 is 26. Namely, in a case where the number of error bits in data is not larger than 26, the error checking and correcting unit 620 is capable of detecting the error bits and correcting the data. It should be noted that the present invention is not limited thereto and the maximum number of error correcting bits of the error checking and correcting unit may be any suitable value, such as 4, 16 or 64.

In particular, after the data is written into the page of the physical block, the memory management unit 614 gives a write confirm command to the flash memory chip 606 to determine whether the write data which just is written has any error bit. To be specific, when the flash memory chip 606 receives the write confirm command, the flash memory chip 606 reads data from the physical page which just is written into; the error checking and correcting unit 620 performs the error checking and correcting process to determinate whether the read data has any error bit; and the flash memory chip 606 transmits the result of the error checking and correcting process, thereby the memory management unit 614 determinates the write data which just is written has any error bit based the result of the error checking and correcting process performed by the error checking and correcting unit 620.

For example, during the execution of the host write command, if the error checking and correcting unit 620 determines the data read from the physical page P2 of the physical block 122-(D+1) has error bits and the number of error bits is larger than the maximum number of error correcting bits of the error checking and correcting unit 620 (i.e. the error checking and correcting unit 620 can not correct the error bits), the memory management unit 614 moves valid data stored in other physical pages of the physical block 122-(D+1) to another physical block (e.g. the physical block 122-(D+2)) and marks the physical block 122-(D+1) as the bad physical block. And, the memory management unit 614 sends a write error message to the host system 1000. For example, the host system 1000 may re-send the host write command and the write data corresponding to the host write command according to the write error message.

Additionally, in a case where the error checking and correcting unit 620 determines the data read from the physical page P2 of the physical block 122-(D+1) has error bits, if the number of error bits is not larger than the maximum number of error correcting bits of the error checking and correcting unit 620 (i.e. the error checking and correcting unit 620 can correct the error bits), the memory management unit 614 determines whether the number of error bits is larger than the error bit threshold value based on the result of the error checking and correcting process performed by the error checking and correcting unit 620. And, if the number of error bits is larger than the error bit threshold value, the memory management unit 204 moves valid data stored in all of the physical pages of the physical block 122-(D+1) to another physical block (e.g. the physical block 122-(D+2)) and marks the physical block 122-(D+1) as the bad physical block.

Furthermore, in the case where the memory management unit 614 determines the number of error bits in the data read from the physical page P2 of the physical block 122-(D+1) is not larger than the error bit threshold value based on the result of the error checking and correcting process performed by the error checking and correcting unit 620, the memory management unit 614 marks the physical block 122-(D+1) as the unreliable physical block.

It should be mentioned that the memory management unit 614 reads data which just is written from a physical block to verify whether the data is written correctly when the memory management unit 614 performs the write operation to the physical block. However, the present invention is not limited thereto, in another exemplary embodiment of the present invention, the memory management unit 614 further read data stored in other physical pages of the written physical block to determine the status of the written physical block.

Figure 7:
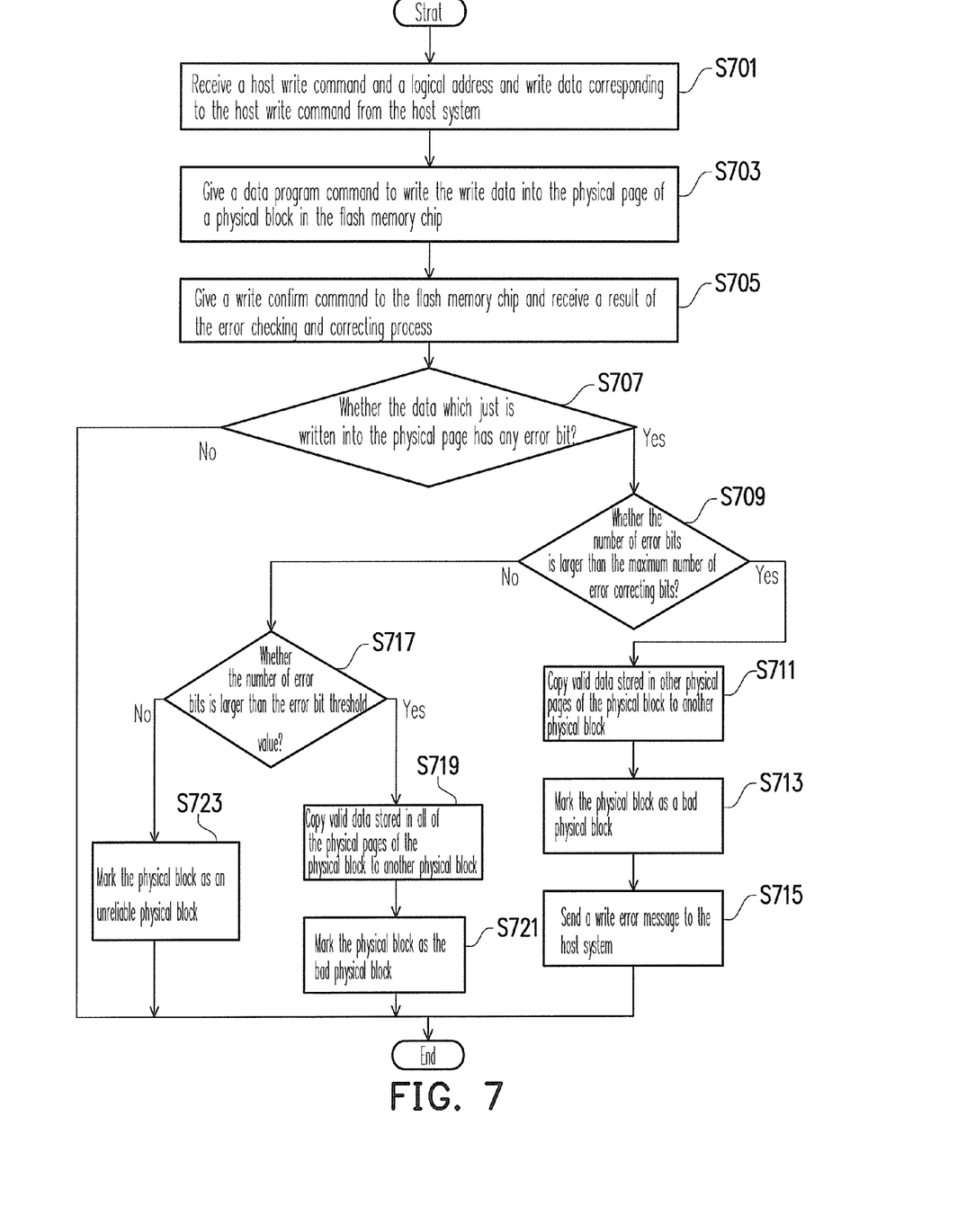
FIG. 7 is a flowchart illustrating a data writing method according to the second exemplary embodiment of the present invention.

FIG. 7 is a flowchart illustrating a data writing method according to the second exemplary embodiment of the present invention.

Referring to FIG. 7, in step S701 the flash memory controller 604 receives a host write command and a logical address and write data corresponding to the host write command from the host system 1000.

In step S703, the memory management unit 614 of the flash memory controller 604 uses a data program command to write the write data into the physical page of a physical block in the flash memory chip 606 (e.g. the physical page P2 of the physical block 122-(D+1)) based on the logical block that the logical address belongs to.

Thereafter, in step S705, the memory management unit 614 gives a write confirm command to the flash memory chip 606 and receives a result of the error checking and correcting process. And, in step S707 the memory management unit 614 determinates whether the data which just is written into the physical page (e.g. the physical page P2 of the physical block 122-(D+1)) has any error bit.

If in the step S707, it is determined the data which just is written into the physical page does not have any error bit based on the result of the error checking and correcting process, the process shown in FIG. 7 is terminated.

If in the step S707, it is determined that the data which just is written into the physical page has at least one error bit, in step S709 the memory management unit 614 determines whether the number of error bits is larger than the maximum number of error correcting bits based on the result of the error checking and correcting process. And, if the number of error bits is larger than the maximum number of error correcting bits, in step S711 the memory management unit 614 copies valid data stored in other physical pages of the physical block to another physical block (e.g. the physical block 122-(D+2)) and in step S713 the memory management unit 614 marks the physical block (i.e. the physical block is written in step S703) as the bad physical block. Thereafter, in the step S715 the memory management unit 204 sends a write error message to the host system 1000, and the process shown in FIG. 7 is terminated.

If the number of error bits is not larger than the maximum number of error correcting bits, in step S717 the memory management unit 614 determines whether the number of error bits is larger than the error bit threshold value based on the result of the error checking and correcting process. If the number of error bits is larger than the error bit threshold value, in step S719 the memory management unit 614 copies valid data stored in all the physical pages of the physical block to another physical block (e.g. the physical block 122-(D+2)). And, in the step S721 the memory management unit 614 marks the physical block (i.e. the physical block is written in step S703) as the bad physical block, and the process shown in FIG. 7 is terminated.

If the number of error bits is not larger than the error bit threshold value, in step S723 the memory management unit 614 marks the physical block (i.e. the physical block is written in step S703) as the unreliable physical block, and the process shown in FIG. 7 is terminated.

As described above, the data writing method provided by the present invention determines whether there is an error bit in data written into a flash memory, thereby the correctness of the data can effectively be ensured. Additionally, when data has at least one error bit, a physical block is marked according to an error level, thereby preventing the usage of the physical block which is unreliable and increasing the reliability of a flash memory storage system. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data writing method for ensuring data writing correctly from a host system into a flash memory chip, wherein the flash memory chip includes a plurality of physical blocks, and each of the physical blocks has a plurality of physical pages, the data writing method comprising:

grouping the physical blocks into at least a data area, a spare area and a replacement area;

receiving a host write command and write data corresponding to the host write command from the host system and executing the host write command by the flash memory controller;

giving a data program command to the flash memory chip during the execution of the host write command to write the write data into one of the physical blocks of the spare area; and giving a read command to the flash memory chip before sending an acknowledgement message informing that the host write command is completed to the host system to determine whether at least a portion of data stored in one of the physical pages in the one of the physical blocks corresponding to the host write command has at least one error bit, wherein if the at least a portion of data stored in the one of the physical pages in the one of the physical blocks has the at least one error bit and the number of the at least one error bit is not larger than the maximum number of error correcting bits and is larger than an error bit threshold value, moving data stored in the one of the physical block to another physical block selected from the replacement area, and marking the one of the physical block as a bad physical block, wherein if the at least a portion of data stored in the one of the physical pages in the one of the physical blocks has the at least one error bit and the number of the at least one error bit is not larger than an error bit threshold value, marking the one of the physical block as an unreliable physical block, wherein the unreliable physical block is used for writing data only when the physical blocks of the replacement area are exhausted.

2. The data writing method according to claim 1, wherein the flash memory controller has an error checking and correcting unit, wherein the step of giving the read command to the flash memory chip before sending the acknowledgement message informing that the host write command is completed to the host system to determine whether the at least a portion of data stored in one of the physical pages in the one of the physical blocks has the at least one error bit comprises:

giving the read command to the flash memory chip to read data from the one of the physical blocks; and determining whether the at least a portion of data stored in the one of the physical blocks has the at least one error bit according to the read data through the error checking and correcting unit.

3. The data writing method according to claim 1, wherein the data writing method further comprises:

when the at least a portion of data stored in the one of the physical pages in the one of the physical blocks has the at least one error bit and the number of the at least one error bit is larger than the maximum number of error correcting bits, moving data stored in other physical pages in the one of the physical blocks having the at least one error bit to another physical block selected from the replacement area, and marking the one of the physical blocks as a bad physical block.

4. The data writing method according to claim 1, further comprising:

sending a write error message to the host system by the flash memory controller when the at least a portion of data in the one of the physical blocks has the at least one error bit and is corresponding to the host write command.

5. The data writing method according to claim 1, further comprising:

using an unreliable physical block table to record the unreliable physical block.

6. A flash memory controller for ensuring data writing correctly from a host system into a flash memory chip, wherein the flash memory chip includes a plurality of physical blocks, and each of the physical blocks has a plurality of physical pages, the flash memory controller comprising:

a microprocessor unit;

a flash memory interface unit, coupled to the microprocessor unit, and configured to connect to the flash memory chip;

a host interface unit, coupled to the microprocessor unit and configured to receive a host write command and write data corresponding to the host write command from the host system; and a physical memory management unit, coupled to the microprocessor unit and configured to group the physical blocks into at least a data area, a spare area and a replacement area, wherein the physical memory management unit gives a data program command to the flash memory chip during execution of the host write command to write the write data into one of the physical blocks of the spare area, wherein the physical memory management unit gives a read command to the flash memory chip before sending an acknowledgement message informing that the host write command is completed to the host system to determine whether at least a portion of data stored in one of the physical pages in the one of the physical blocks corresponding to the host write command has at least one error bit, wherein if the at least a portion of data stored in the one of the physical pages in the one of the physical blocks has the at least one error bit and the number of the at least one error bit is not larger than the maximum number of error correcting bits and is larger than an error bit threshold value, the physical memory management unit moves data stored in the one of the physical blocks to another physical block selected from the replacement area and marks the one of the physical blocks as a bad physical block, wherein if the at least a portion of data stored in the one of the physical pages in the one of the physical blocks has the at least one error bit and the number of the at least one error bit is not larger than an error bit threshold value, the physical memory management unit marks the one of the physical blocks as an unreliable physical block, wherein the physical memory management unit uses the unreliable physical block for writing data only when the physical blocks of the replacement area are exhausted.

7. The flash memory controller according to claim 6, further comprising an error checking and correcting unit, wherein the physical memory management unit gives the read command to the flash memory chip to read data from the one of the physical blocks, and the error checking and correcting unit determines whether the at least a portion of data stored in the one of the physical blocks has the at least one error bit according to the read data during the execution of the host write command.

8. The flash memory controller according to claim 6, and wherein when the at least a portion of data stored in the one of the physical pages in the one of the physical blocks has the at least one error bit and the number of the at least one error bit is larger than the maximum number of error correcting bits, the physical memory management unit moves data stored in the other physical pages in the one of the physical blocks having the at least one error bit to another physical block among the physical blocks and marks the one of the physical block as a bad physical block.

9. The flash memory controller according to claim 6, wherein when the at least a portion of data in the one of the physical blocks has the at least one error bit and is corresponding to the host write command, the physical memory management unit sends a write error message to the host system.

10. A flash memory storage system for ensuring data writing correctly, comprising:

a flash memory chip having a plurality of physical blocks, wherein each of the physical blocks has a plurality of physical pages;

a connector, configured to connect to a host system and to receive a host write command and write data corresponding to the host write command from the host system; and a flash memory controller, coupled to the flash memory chip and the connector, and configured to group the physical blocks into at least a data area, a spare area and a replacement area, wherein the flash memory controller gives a data program command to the flash memory chip during execution of the host write command to write the write data into one of the physical blocks of the spare area, wherein the flash memory controller gives a read command to the flash memory chip before sending an acknowledgement message informing that the host write command is completed to the host system to determine whether at least a portion of data stored in one of the physical pages in the one of the physical blocks corresponding to the host write command has at least one error bit, wherein if at least a portion of data stored in the one of the physical pages in the one of the physical blocks has the at least one error bit and the number of the at least one error bit is not larger than the maximum number of error correcting bits and is larger than an error bit threshold value, the flash memory controller moves data stored in the one of the physical blocks to another physical block selected from the replacement area and marks the one of the physical blocks as a bad physical block, wherein if the at least a portion of data stored in the one of the physical pages in the one of the physical blocks has the at least one error bit and the number of the at least one error bit is not larger than an error bit threshold value, the flash memory controller marks the one of the physical blocks as an unreliable physical block, wherein the flash memory controller uses the unreliable physical block for writing data only when the physical blocks of the replacement area are exhausted.

11. The flash memory storage system according to claim 10, wherein the flash memory controller has an error checking and correcting unit, wherein the flash memory controller gives the read command to the flash memory chip to read data from the one of the physical blocks, and the error checking and correcting unit determines whether the at least a portion of data stored in the one of the physical blocks has the at least one error bit according to the read data during the execution of the host write command.

12. The flash memory storage system according to claim 10, and wherein when the at least a portion of data stored in the one of the physical pages in the one of the physical blocks has the at least one error bit and the number of the at least one error bit is larger than the maximum number of error correcting bits, the flash memory controller moves data stored in other physical pages in the one of the physical blocks having the at least one error bit to another physical block among the physical blocks and marks the one of the physical blocks as a bad physical block.

13. The flash memory storage system according to claim 10, wherein when the at least a portion of data in the one of the physical blocks has the at least one error bit and is corresponding to the host write command, the flash memory controller sends a write error message to the host system by the flash memory controller.

* * * * *